US011409024B2

(12) United States Patent
Srivastava et al.

(10) Patent No.: US 11,409,024 B2
(45) Date of Patent: *Aug. 9, 2022

(54) METHODS AND SYSTEMS FOR GENERATING SIMULATION GRIDS VIA ZONE BY ZONE MAPPING FROM DESIGN SPACE

(71) Applicant: ExxonMobil Upstream Research Company, Spring, TX (US)

(72) Inventors: Priyesh Srivastava, Bangalore (IN); Sha Miao, Spring, TX (US); Aakash S. Bhowmick, Bengaluru (IN); Yifei Xu, Houston, TX (US); Hao Huang, The Woodlands, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 177 days.

This patent is subject to a terminal disclaimer.

(21) Appl. No.: 16/948,718

(22) Filed: Sep. 29, 2020

(65) Prior Publication Data

US 2021/0011193 A1 Jan. 14, 2021

Related U.S. Application Data

(63) Continuation-in-part of application No. 16/389,046, filed on Dec. 23, 2019.

(Continued)

(51) Int. Cl.
*G06F 30/23* (2020.01)
*G01V 99/00* (2009.01)
*G06T 17/20* (2006.01)

(52) U.S. Cl.
CPC ............ *G01V 99/005* (2013.01); *G06F 30/23* (2020.01); *G06T 17/20* (2013.01)

(58) Field of Classification Search
CPC ......... G06F 30/23; G06F 30/20; G06T 17/20; G01V 99/005
(Continued)

(56) References Cited

U.S. PATENT DOCUMENTS 6,106,561 A 8/2000 Farmer
9,053,570 B1 6/2015 Mallet et al.
(Continued)

FOREIGN PATENT DOCUMENTS

EP 2631685 A2 8/2013

OTHER PUBLICATIONS

Branets et al. (2015) "Capturing Geologic Complexity in a Simulation Grid", SPE-173270-MS, SPE Reservation Simulation Symposium, Houston, Feb. 2015, pp. 1-10.
(Continued)

*Primary Examiner* — Andre Pierre Louis
(74) *Attorney, Agent, or Firm* — Leandro Arechederra, III

(57) ABSTRACT

An illustrative geologic modeling method may comprise: obtaining a geologic model representing a subsurface region in physical space, the subsurface region being divided into multiple zones; sequentially generating a physical space simulation mesh for each of said multiple zones by: (a) mapping a current zone of the physical space geologic model to a current zone of a design space model representing a current zone of an unfaulted subsurface region; (b) gridding the design space model to obtain a design space mesh; (c) partitioning cells in the current zone of the design space mesh with faults mapped from the current zone of the physical space geologic model, thereby obtaining a partitioned design space mesh for the current zone; and (d) reverse mapping the partitioned design space mesh for the current zone to the physical space for the current zone.

20 Claims, 7 Drawing Sheets

Related U.S. Application Data

(60) Provisional application No. 62/952,586, filed on Dec. 23, 2019, provisional application No. 62/688,553, filed on Jun. 22, 2018, provisional application No. 62/752,624, filed on Oct. 30, 2018, provisional application No. 62/752,637, filed on Oct. 30, 2018.

(58) Field of Classification Search
USPC .................................................. 703/6, 9, 10
See application file for complete search history.

(56) References Cited

U.S. PATENT DOCUMENTS

| | | |
|---|---|---|
| 9,395,466 B1 | 7/2016 | Mallet et al. |
| 9,536,022 B1 | 1/2017 | Tertois et al. |
| 9,600,608 B2 | 3/2017 | Poudret et al. |
| 9,652,889 B2 | 5/2017 | Young et al. |
| 10,036,829 B2* | 7/2018 | Ghayour .............. G01V 99/005 |
| 10,107,938 B2 | 10/2018 | Huang et al. |
| 2011/0115787 A1 | 5/2011 | Kadlec |
| 2012/0265510 A1 | 10/2012 | Lepage |
| 2013/0231903 A1 | 9/2013 | Li et al. |
| 2013/0246031 A1 | 9/2013 | Wu et al. |
| 2015/0316683 A1 | 11/2015 | Purves et al. |
| 2016/0125555 A1* | 5/2016 | Branets ................ G06Q 10/067 705/348 |
| 2017/0184760 A1* | 6/2017 | Li ........................ G01V 99/005 |
| 2018/0031719 A1 | 2/2018 | Huang et al. |
| 2018/0348401 A1 | 12/2018 | Imhof et al. |

OTHER PUBLICATIONS

Natali, M. et al. (2012) "Rapid Visualization of Geological Concepts", 2012 25th SIBGRAPI Conference on Graphics, Patterns, and Images, Aug. 22-25, 2012, pp. 150-157.

Natali, M. et al. (2013) "Modeling Terrains and Subsurface Geology", EuroGraphics 2013 State of the Art Reports (STARs), pp. 155-173.

* cited by examiner

METHODS AND SYSTEMS FOR GENERATING SIMULATION GRIDS VIA ZONE BY ZONE MAPPING FROM DESIGN SPACE

CROSS-REFERENCE TO RELATED APPLICATION(S)

This application (i) claims the priority of U.S. Provisional Application Ser. No. 62/952,586, filed Dec. 23, 2019, and (ii) is a continuation-in-part of co-pending U.S. patent application Ser. No. 16/389,046, filed Apr. 19, 2019, which claimed priority to U.S. Provisional Application Ser. No. 62/688,553, filed Jun. 22, 2018, 62/752,624, filed Oct. 30, 2018, and 62/752,637, filed Oct. 30, 2018; the disclosures of which are incorporated herein by reference in their entirety.

TECHNICAL FIELD

The present application relates generally to the field of hydrocarbon exploration, development, and production and, more particularly, to geologic modeling and reservoir simulation. Specifically, the disclosure relates to methods and systems for generating a volumetric mesh (such as a grid) that may be used for various hydrocarbon operations, such as hydrocarbon exploration, development, and/or production operations. For example, the volumetric mesh may be used in various reservoir simulations for evaluating strategies to develop the reservoir and to extract hydrocarbons from the reservoir.

BACKGROUND

A geologic model is a computer-based three-dimensional ("3D") representation of a region beneath the earth's surface. Such models can be used to model a petroleum reservoir, a depositional basin, or other regions which may have valuable mineral resources. Once the model is constructed, it can be used for various purposes, many of which are intended to facilitate efficient and economical recovery of the valuable resources. For example, the geologic model may be used in various hydrocarbon exploration, development, and production operations. As a more specific example, the geologic model may be used as an input to simulations of petroleum reservoir fluid flows during production operations, which are used to plan well placements and predict hydrocarbon production from a petroleum reservoir over time.

When performing reservoir simulations, geologic models are typically divided into a mesh of volumetric cells, i.e., volumetric elements having material properties values that are constant (or otherwise well-defined) within each cell. There is a tradeoff between the number and size of volumetric elements, with more numerous smaller elements typically providing higher accuracies at the cost of higher computational demands. A gridding strategy is considered desirable if it minimizes the computational burden for a given level of accuracy, without requiring an inordinate time to complete the gridding process.

An example of a gridding method is described in U.S. Patent Application Publication No. 2012/0265510 which describes a method to create a grid from a depositional space that includes providing a conformal mesh (which is conformal to geological discontinuities of a geologic model) that includes depositional domain coordinates associated with a depositional domain; providing, in the depositional domain, an initial, at least vertically structured multi-dimensional grid, that includes initial nodes that define grid cells; referencing the conformal mesh to identify a set of grid cells of the initial grid traversed by the geological discontinuities; splitting each of the grid cells in the set to form sub cells; and assigning geological domain coordinates to new nodes to generate a final grid. However, the method in U.S. Patent Application Publication No. 2012/0265510 requires the use of a conformal mesh and a vertically structured grid.

Thus, various gridding strategies are known, but continuing improvements are sought. In particular, it would be desirable to have improved gridding methods that are capable of capturing key geologic features while enabling efficient, yet robust, solution methods.

SUMMARY

Accordingly, there are disclosed herein geologic modeling methods and systems employing an improved simulation gridding technique that executes quickly and provides better cell alignments. For example, one or more embodiments of a geologic modeling method may comprise: obtaining a geologic model representing a subsurface region in physical space, the subsurface region being divided into multiple zones; sequentially generating a physical space simulation mesh for each of said multiple zones by: (a) mapping a current zone of the physical space geologic model to a current zone of a design space model representing a current zone of an unfaulted subsurface region; (b) gridding the design space model to obtain a design space mesh, said gridding beginning with an initial set of nodes on a first horizon of the current zone of the design space model, said initial set of nodes being determined by mapping nodes from the same horizon of a connected, previously-meshed zone; (c) partitioning cells in the current zone of the design space mesh with faults mapped from the current zone of the physical space geologic model, thereby obtaining a partitioned design space mesh for the current zone; and (d) reverse mapping the partitioned design space mesh for the current zone to the physical space for the current zone; and outputting the physical space simulation mesh.

For example, one or more embodiments of a geologic modeling method may comprise: obtaining a geologic model representing a subsurface region in physical space, the subsurface region having faults organized in an order; mapping the physical space geologic model to a design space model representing an unfaulted subsurface region; gridding the design space model to obtain a design space mesh; applying the faults in hierarchical order to partition cells in the design space mesh, thereby obtaining a partitioned design space mesh; reverse mapping the partitioned design space mesh to the physical space to obtain a physical space simulation mesh; and outputting the physical space simulation mesh.

The physical space simulation mesh generated pursuant to either method may be suitable for use in one or more hydrocarbon operations, such as hydrocarbon exploration, development, or production operations. For example, the physical space simulation mesh may be suitable for use in in evaluating fluid flow in the subsurface, such as fluid flow during one or more hydrocarbon production operations.

One or more geologic modeling systems described herein may comprise: a memory having geologic modeling software; and one or more processors coupled to the memory to execute the geologic modeling software. The software causes the one or more processors to perform operations that implement at least one of the geologic modeling methods described herein.

One or more illustrative geologic modeling software product embodiments described herein may comprise a non-transitory information storage medium having computer readable program code embodied therein. When executed, the program code configures a computer to implement at least one of the geologic modeling methods described herein.

Each of the foregoing embodiments may be employed individually or conjointly, and may further employ one or more of the following features in any suitable combination. For example, in one or more embodiments, outputting the physical space simulation mesh may comprise storing the physical space simulation mesh on a non-transitory information storage device. For example, in one or more embodiments, outputting the physical space simulation mesh may comprise displaying a visual representation of the geologic model with the physical space simulation mesh. For example, in one or more embodiments, the methods described herein may further comprise employing the physical space simulation mesh to evaluate a well placement strategy. For example, in one or more embodiments, gridding may comprise providing an areal grid that spans the design space model; identifying, as nodes, intersections of vertical extrusions of vertices in the areal grid with geobody surfaces in the design space model; and connecting said nodes to form the design space mesh. In one or more embodiments, gridding may comprise subdividing design space mesh cells having a size above a threshold. In one or more embodiments, the sequential generating operation proceeds in a directional fashion from a bottom-most zone to a top-most zone. In one or more embodiments, the reverse mapping comprises identifying, for each node in design space, a cell containing that node; and applying a map function associated with the identified cell to determine a corresponding location in the physical space geologic model. In one or more embodiments, said identifying includes searching a set of cells, and wherein if the node is associated with a given side of a fault, the set excludes any buffer regions associated with an opposite side of the fault. In one or more embodiments, the method may further comprise determining cross-horizon transmissibilities between physical space geologic model mesh cells adjacent to each other across a zone interface. In one or more embodiments, the adjacent physical space geologic model mesh cells are at least partially partitioned by a fault having a perpendicular trim surface at its terminus, the fault at least partly defining multiple subcells, and said cross-horizon transmissibilities are determined between subcells on a same side of the fault and on a same side of the trim surface, but are zero or not determined between subcells with different sideness. In one or more embodiments, the method further comprises determining cross-fault transmissibilities between physical space geologic model mesh cells adjacent to each other across a fault by: projecting a mesh cell face onto a face of a mesh cell on an opposite side of the fault; and determining an overlapping area.

BRIEF DESCRIPTION OF THE DRAWINGS

The advantages of the present invention may be better understood by referring to the following detailed description and the attached drawings. It should be understood that the drawings and corresponding detailed description do not limit the disclosure, but on the contrary, they provide the foundation for understanding all modifications, equivalents, and alternatives falling within the scope of the appended claims.

NOMENCLATURE

Figure 1A:
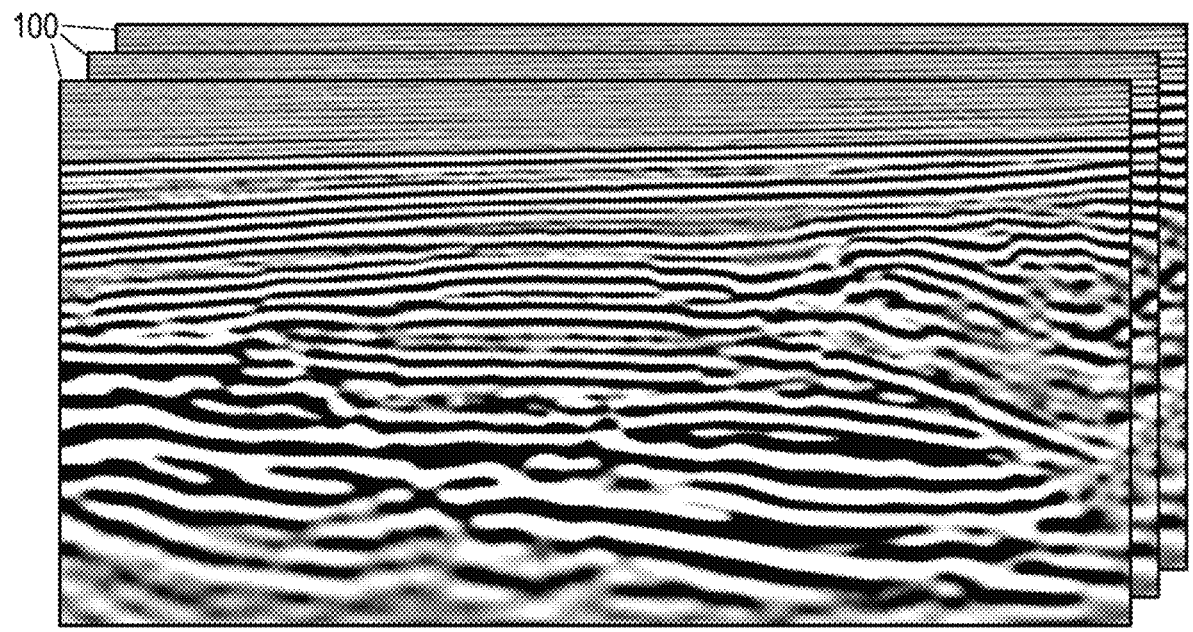
FIG. 1A shows an illustrative measured seismic image volume.

Various terms as used herein are defined herein. To the extent a term used in a claim is not defined herein, it should be given the broadest definition persons in the pertinent art have given that term as reflected in at least one printed publication or issued patent.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide (H2S), and carbon dioxide (CO2). Hydrocarbons may be located within or adjacent to mineral matrices within the earth (i.e., reservoirs) such as sedimentary rock, sands, silicilytes, carbonates, diatomites, and other porous media. Hydrocarbons may be produced from hydrocarbon reservoirs through wells penetrating a hydrocarbon-containing formation. Hydrocarbons derived from a hydrocarbon reservoir may include, but are not limited to, petroleum, kerogen, bitumen, pyrobitumen, asphaltenes, tars, oils, natural gas, or combinations thereof.

As used herein, "hydrocarbon exploration" refers to any activity associated with determining the location of hydrocarbons in subsurface regions, especially those activities conducted to acquire measurement data associated with the subsurface regions and to create models based on the data to identify potential locations of hydrocarbon accumulation. The measurement data may include seismic data, gravity data, magnetic data, electromagnetic data, and the like.

As used herein, "hydrocarbon development" refers to any activity associated with planning for hydrocarbon production, especially those activities conducted to analyze and manipulate models to identify preferred strategies and techniques for accessing and/or extracting subsurface hydrocarbons, and based thereon, to formulate plans for production including stages of activity, equipment to be used, and the like.

As used herein, "hydrocarbon production" refers to any activity associated with extracting hydrocarbons from subsurface location, especially those activities conducted to form wellbores, log the wells, complete the wells, service and maintain the wells, treat the formations (e.g., acidization or fracturing to increase flow), mobilize subsurface hydrocarbons (e.g., injection of gas or liquid to increase drive pressure), regardless or whether those activities are associated with primary, secondary, or tertiary production.

As used herein, "hydrocarbon operations" refers to any activity associated with hydrocarbon exploration, hydrocarbon development, and/or hydrocarbon production.

As used herein, "surfaces" refer to geologic features, such as horizons and faults, as well as technical features, such as model boundaries, concession boundaries, or arbitrarily defined subregion boundaries. Horizons separate different regions of rock, often along an interface between rocks of different age or type. A fault is a discontinuity within a rock region, which may be associated with a displacement of the rock on one side of the fault from its original position relative to the rock on the other side of the fault.

As used herein, "structural framework" or "framework" refer to a subsurface representation formed from representations (e.g., polyline or mesh representations) of surfaces. A framework may be formed by surfaces of geologic, engineering, planning or other technical relevance.

As used herein, "subsurface model" refers to a reservoir model, geomechanical model, watertight model, and/or a geologic model. The subsurface model may include subsurface data distributed within the model in two dimensions, three dimensions, or four or more dimensions.

As used herein, "watertight" means that the one or more surfaces defining the relevant subregion(s) of a model have no holes and no overlaps with other surfaces bounding that subregion. A watertight framework of faults and horizons is one that fully divides a specified region of interest into watertight subregions such that any path from one subregion to another must cross a surface. As a consequence, each fault and horizon in the framework either exists as a subregion boundary, or is fully contained within a subregion.

As used herein, "watertight model" is a model of the subsurface region having one or more watertight subregions.

As used herein, "geologic model" is a model of the subsurface region having subregions with associated static properties (such as facies, lithology, porosity, permeability, or the proportion of sand and shale). The subregions may be defined by surfaces and/or a mesh that divides the subsurface region into polygonal cells (of two, three, or more dimensions).

As used herein, "reservoir model" is a geologic model that also associates with each subregion one or more dynamic properties that vary over the timescale of resource extraction, such as fluid composition, pressure, and relative permeability.

As used herein, "geomechanical model" is a geologic model having static properties suitable for modeling the mechanical response of the rocks in the subsurface region, such as rock compressibility and Poisson's ratio. Geomechanical models are useful for measuring effects such as compaction, subsidence, surface heaving, faulting, and seismic events, which may result from, e.g., fluid injection and extraction.

As used herein, "mesh" or "grid" is a representation of a region of space (e.g., 2-D domain or 3-D domain), using nodes and edges that define a set of polygons or polyhedra disposed within the region. The mesh may also conform to, or define, surfaces within the region. Properties may be assigned to some or all polygons. Though the terms "mesh" and "grid" may be used interchangeably, when they are employed together the term "mesh" is used to indicate a finer (more sub-divided) representation and "grid" is used to indicate a coarser (less-subdivided) representation.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve executing a reservoir-simulator computer program on a processor to compute composition, pressure, or movement of fluid as function of time and space for a specified scenario of injection and production wells by solving a set of reservoir fluid flow equations. A geomechanical simulation may involve executing a geomechanical simulator computer program on a processor to compute displacement, strain, stress, shear slip, or energy release of the rock as a function of time and space in response to fluid extraction and injection.

DETAILED DESCRIPTION

Various specific embodiments, versions, and examples of the invention will now be described, including preferred embodiments and definitions that are adopted herein for purposes of understanding the claimed invention. While the following detailed description gives specific preferred embodiments, those skilled in the art will appreciate that these embodiments are exemplary only, and that the invention can be practiced in other ways. For purposes of determining infringement, the scope of the invention is determined by one or more of the appended claims, including those variations and modifications of the recited limitations that are equivalent to the ones that are recited. Any reference to the "invention" may refer to one or more, but not necessarily all, of the inventions defined by the claims.

FIG. 1A shows an illustrative measured seismic image volume 100, which can be expressed in many ways but is here shown as parallel slices of a three-dimensional volume. The measured image volume 100 is typically obtained by processing of field-recorded seismic survey traces representing seismic wave responses to shots or other sources of seismic energy that have been triggered at an array of shot locations. The processing corrects for seismic wave travel times to determine locations of reflective interfaces, and combines repeated measurements at each location to increase the signal to noise ratio. While seismic reflectivity is commonly employed, other seismic wave properties can also or alternatively be derived from the traces and used to construct the measured seismic image volume. One particular transformation of interest is the inversion of the seismic data to estimate petrophysical parameters such as porosity, clay volume fraction, etc. that are often part the geological model.

Figure 1B:
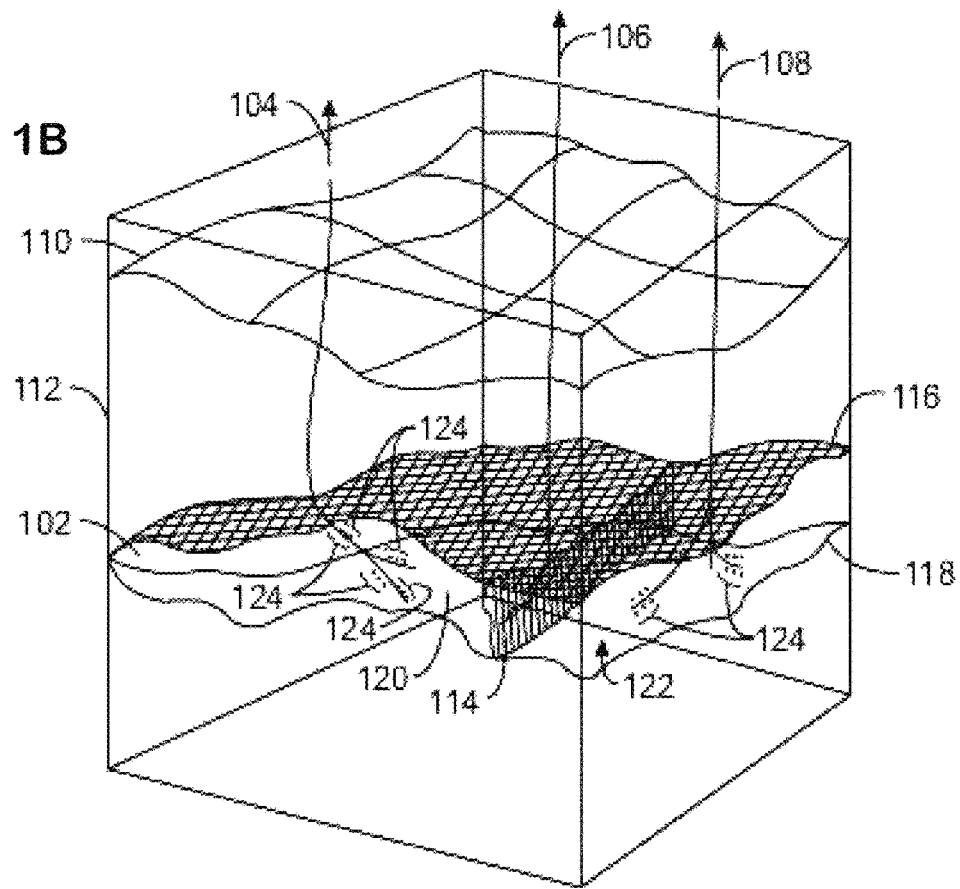
FIG. 1B shows an illustrative "watertight" subsurface model.

FIG. 1B shows an illustrative subsurface model having features that may be derived from a seismic image volume. The illustrative model includes a number of surfaces defining the boundaries of a potentially hydrocarbon-bearing formation 102 that may serve as a reservoir of oil or natural gas. The model facilitates planning well placements and drilling the wells (e.g., wells 104, 106, 108), from the Earth's surface 110 through layers of overburden 112 to access the formation 102. The illustrative model surfaces may include faults 114 and horizons 116, 118. The surfaces may intersect in a fashion that divides the reservoir formation 102 into distinct compartments 120, 122. The petrophysical parameters of each compartment may be estimated based on the seismic image data, measured using logging instruments in exploratory wells, and/or determined by other methods known in the art.

Modern drilling techniques enable the wells 104, 106, 108 to deviate from the vertical orientation and to be directionally drilled to follow the reservoir 102. Further, the wells can be branched to increase the amount of wellbore contact with the reservoir, as shown for wells 104 and 108. The wells 104, 106, and 108, can have numerous areas with perforations 124 (indicated as dots next to the wells) to provide a flow path for fluids, such as hydrocarbons, from the reservoir 102 into the wells 104, 106, and 108 for removal to the surface. If properly employed, such steering and completion techniques may enable faster and more efficient extraction of reservoir fluids.

The locations and paths for the wells 104, 106, and 108, and the location of the perforations 124, may be optimized by performing reservoir fluid flow simulations based on the subsurface model. Subsurface models are often used as inputs to reservoir simulation programs that predict the behavior of fluids contained therein and may also predict the behavior of the formation rocks under various scenarios of hydrocarbon recovery. Miscalculations or mistakes can be costly. For example, miscalculations may result in suboptimal locations for the wells 104, 106, and 108, inhibiting access to the fluids in the reservoir formation. Subsurface model-based planning and simulation provide a mechanism to identify which recovery options offer more economic, efficient, and desirable development plans for a particular reservoir.

More specifically, subsurface model construction begins with extraction of surfaces from a seismic image region, including faults, horizons, and defining any additional surfaces such as boundaries for the region of interest. The different surfaces may be adjusted and trimmed to define closed "watertight" subregions often called zones, compartments, or containers, such as zones 120 and 122. "Watertight" here refers to the absence of gaps where boundary surfaces intersect, and such models are readily achieved if the surfaces are represented using continuous functions, which are able to be shifted, extended, and/or trimmed. Such representations facilitate the moving or refining the surfaces to, e.g., test alternatives for resolving interpretation ambiguities. This ability to move and refine surfaces may lead to higher production by impacting the desired positioning of the wells 104, 106, and 108 or the perforations 124.

While beneficial for many purposes, the surface-based representation does not function well for numerical simulation of reservoir fluid flows. For such simulations, it is preferred to have the model gridded into a mesh in which each cell has homogenous (or otherwise well-defined) material properties and potentially has a defined connectivity or fluid transmissibility to each adjacent cell (each cell with which it shares a cell boundary). An illustrative method for obtaining a simulation mesh is now described with reference to FIGS. 2A-2I, which for purposes of illustration are two-dimensional, vertical cross-sections of a three-dimensional subsurface model.

Figure 2A:
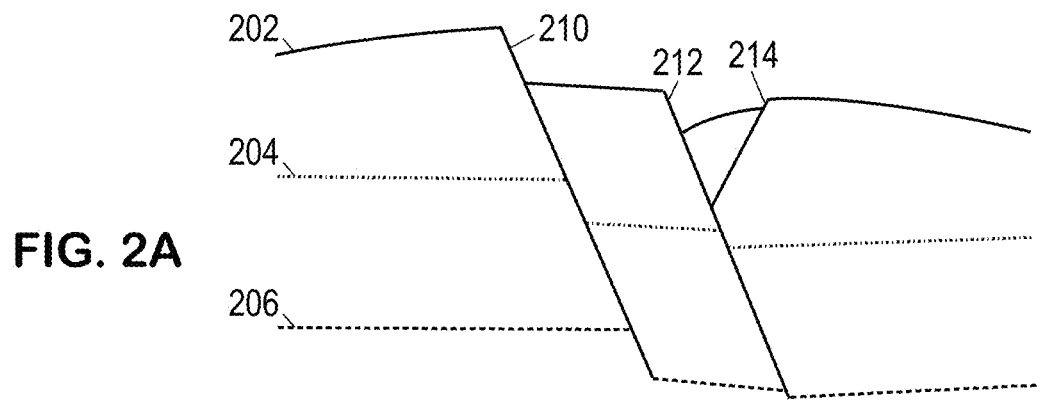
FIG. 2A is a cross-section of an illustrative physical-space model.

FIG. 2A is a subsurface model in which three horizons 202, 204, 206, and three faults 210, 212, 214 are shown. In accordance with the foregoing description, the horizons and faults may be represented by continuous functions that intersect to form a watertight model. Alternatively, the surfaces may be represented by surface meshes. In any case, the modeled volume is a useful representation of the physical substructure but may not be the most convenient representation for engineers to work with. Though a simple example is presented here, faulted models tend to unduly multiply the number of disconnected geobodies such that it becomes difficult and tedious to analyze material properties.

Figure 2B:
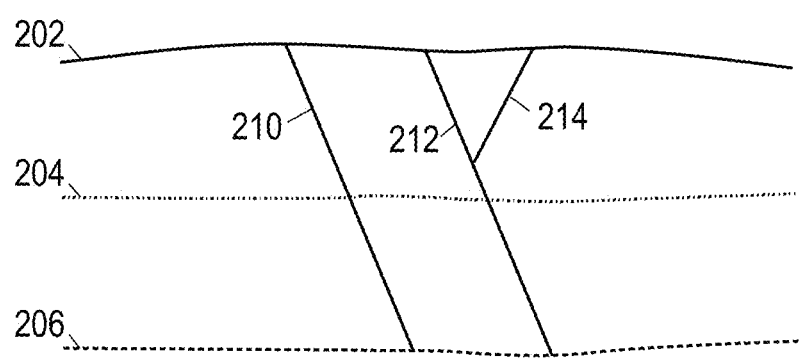
FIG. 2B is a cross-section of an illustrative "unfaulted" subsurface model.

One approach to this issue is to displace and deform the subregions to create a continuous "unfaulted" subsurface model as shown in FIG. 2B. An example of such a transformation process is described in U.S. Pat. No. 10,107,938, titled "Managing Discontinuities in Geologic Models", the disclosure of which is incorporated herein by reference. However, because the process to create a map has a complexity order $O(N^3)$, where N is the number of nodes in the region of interest around the faults, the computational burden may become unduly large. It may be preferred to approach the region of interest in a zone-by-zone fashion, first performing the un-faulting operation for a first zone (e.g., the subregion between surfaces 204 and 206), then performing the operation separately for a second zone (e.g., the subregion between surfaces 202 and 204). Each halving of the number of nodes reduces the computational burden by a factor of about $2^3$.

Figure 2C:
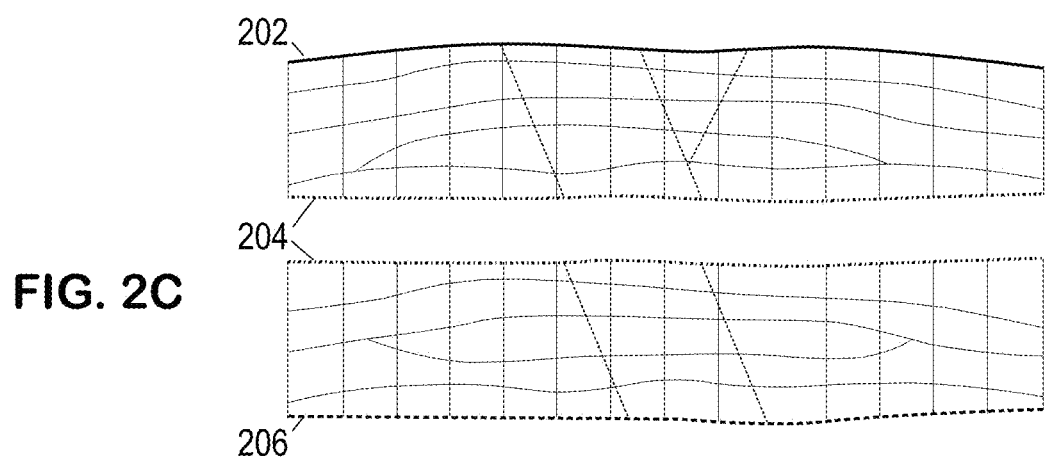
FIG. 2C is a cross-section of an illustrative gridded multi-zone design-space model.

Accordingly, the "real space" representation shown in FIG. 2A may be transformed into a multi-zone "design space" representation (sometimes referred to as a "depositional space" representation) such as that shown in FIG. 2C. Thus, the transformation process seeks to "heal" any faults or other discontinuities in each given zone, thereby restoring all geobodies from their current faulted state and segmented state to a continuous (un-faulted) unified state. As before, the process described in U.S. Pat. No. 10,107,938 may be employed to determine the mapping from physical space to the design space in each zone. "Mapping" refers to a function that associates an input position in physical space with an output position in design space. The function may be explicitly expressed as a mathematical formulation, or as another example, it may be based on a geometric discretization of space in which a mapping function is defined on a cell by cell basis. In the latter case, a point is mapped by first determining which mapping cell it belongs to and then applying a simple mathematical function in that cell. The real-space to design-space mapping is preferably derived and applied in a manner that minimizes deformation and preserves in the design space the resemblance to the physical space.

Thus, horizon 202 is been converted from its faulted form in FIG. 2A to a continuous surface in FIG. 2C. Horizon 204, which for the purposes of the present example is an erosion-created surface, defines both the bottom of the upper formation bed and the top of the lower formation bed. In any case, the faults in horizon 204 and the lowermost horizon are also corrected, thereby creating continuous, unfaulted formation beds. Note that as part of the mapping process, the system may numerically analyze and re-align smaller-scale structures on opposing faces of each fault.

The design space facilitates further work by the scientists and engineers to analyze small scale features, identify boundaries of additional geobodies, and determine suitable values for the material properties of each geobody. These additional geobody boundaries are also represented in FIG. 2C. Also shown is a simulation grid derived for the design space model, spanning the entire region of interest. Various gridding methods are available in the open literature including, e.g., Branets et al., "Capturing Geologic Complexity in a Simulation Grid", SPE-173270-MS, SPE Reservation Simulation Symposium, Houston, February 2015, the disclosure of which is incorporated herein by reference. The illustrated grid is derived by vertically extruding vertices of an areal grid (e.g., a Cartesian grid in the X-Y plane) on the bottom horizon of each zone and finding intersections of the vertical extrusions with the surfaces representing the geobody boundaries, thereby generating a 3D grid that honors the geobody boundaries. Additionally, the areal grid may be refined (i.e., given a finer resolution) near any existing or proposed well trajectories mapped from the real space. Where the grid cells are deemed to be too large, they may be subdivided with the introduction of new nodes where needed. If desired, each grid cell may in turn be sub-gridded to define a volumetric mesh within each subregion of the cell.

Figure 2D:
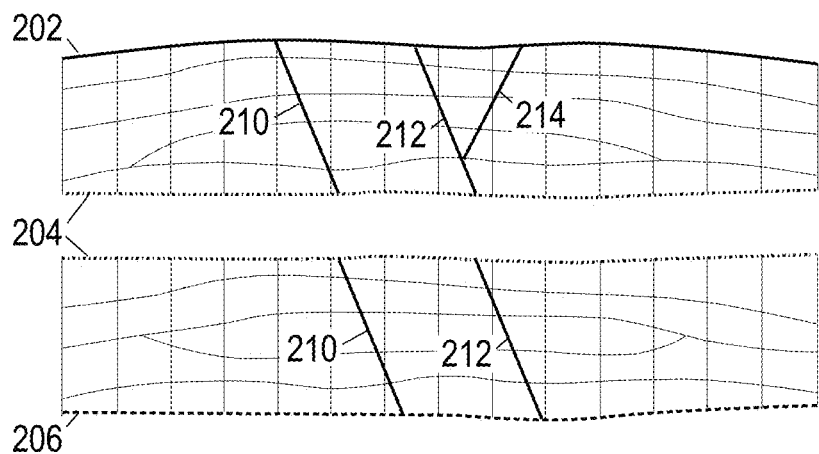
FIG. 2D is a cross-section of an illustrative partitioned design-space model.

The faults are represented in FIG. 2C as dashed lines for easy reference, but the introduction of those faults into the design space is a separate operation as represented in FIG. 2D. For FIG. 2D, a real-space to design-space mapping is applied to the faults 210, 212, 214 to determine the fault locations in the design space. The fault surfaces are applied to the simulation mesh to partition the mesh cells that they intersect. The partitioning process enables an offset to be introduced between the fault faces during the remapping back to physical space. The offset may vary across the fault surface.

Before proceeding further with the process for obtaining a simulation mesh, we turn momentarily to FIGS. 3A-3E for a discussion of the partitioning process and the definition of fault-sided buffer regions.

Figure 3A:
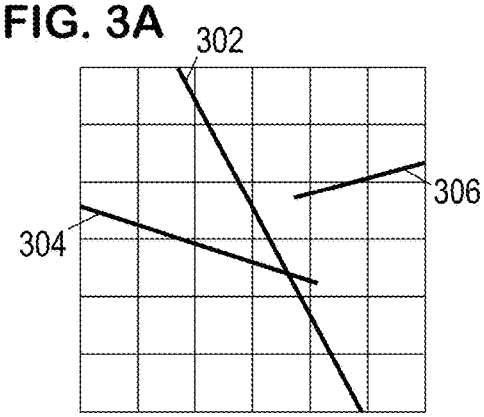
FIG. 3A is a cross-section of an illustrative model having multiple faults.

As the mapping from physical space to design space varies from cell to cell, it is perhaps expected that in mapping the faults (and other surfaces) to design space, the faults in design space may not be watertight with respect to their major faults or horizons. As an illustrative example, FIG. 3A shows a primary fault 302, a secondary fault 304 that overlaps the primary fault 302, and a secondary fault 306 that falls short of the primary fault. To correct this issue, the faults (and other surfaces) are organized in an ordered fashion (e.g., primary fault, secondary fault) or, alternatively each pair of intersecting faults may be related as a truncation pair ("truncation relationship pair") specifying which fault truncates the other. The faults lower in the hierarchical order or lower in the truncation relationship are to be fully contained by faults or surfaces higher in the hierarchy or relationship. The faults are taken in order and applied to subdivide any grid or mesh cells that contain them so that the faults are fully represented by cell faces. The grid cells are fully split if they contain no other faults (or more specifically, no intersections with any faults) from higher in the hierarchy. If the grid cells do contain an intersection of the current fault with a fault from higher in the hierarchy, only the subcell on the appropriate side of that fault is split by the current fault.

Figure 3B:
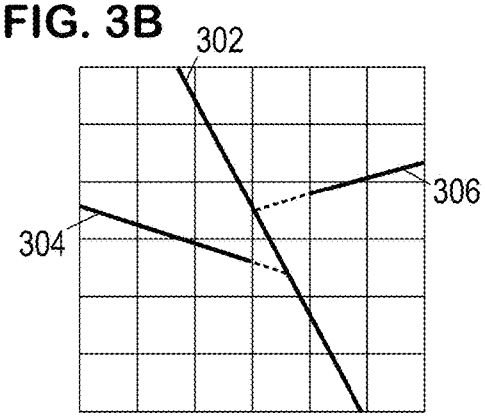
FIG. 3B is a cross-section of an illustrative model having an intersecting fault hierarchy.
Figure 3C:
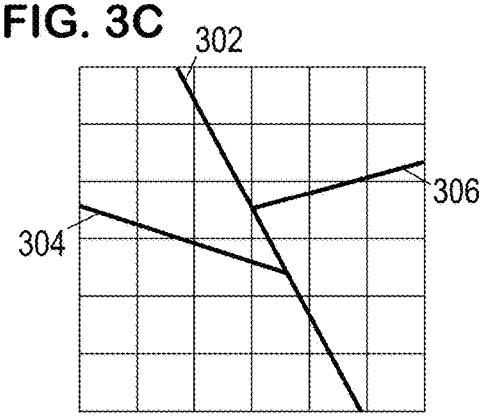
FIG. 3C is a cross-section of an illustrative model having cells partitioned by fault intersections.

FIG. 3B shows the partitioning of grid cells by primary fault 302, and by secondary faults 304, 306 where indicated by solid lines. The dotted portions of these faults are shown in the cells containing an intersection with the primary fault 302. If the secondary fault doesn't reach the intersection with the primary fault (e.g., fault 306), it may be extended using any one of many available techniques. In one illustrative embodiment where the faults are represented by triangulated surfaces, the extension can be achieved by excluding boundary edges from the trim distance calculation where extension needs to be made. As a result, the fault surface may be considered as infinitely extended beyond the missing boundary edges, such that it is only terminated by major faults or horizons where the watertight intersection is sought. FIG. 3C shows the result including the watertight intersections.

Figure 3D:
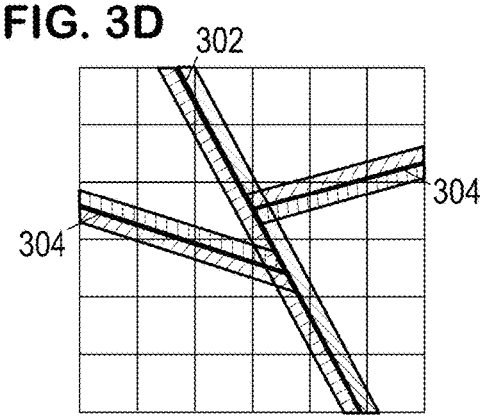
FIG. 3D is a cross-section of an illustrative model having fault-sided buffer regions.
Figure 3E:
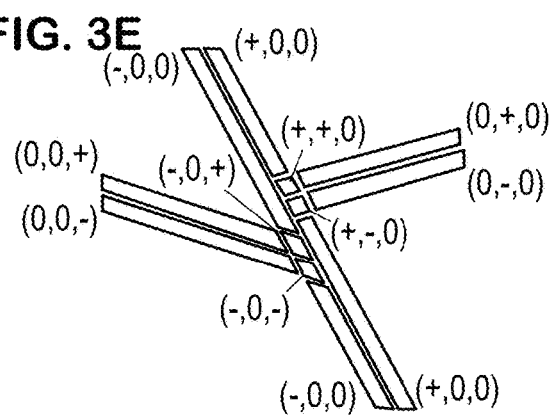
FIG. 3E is an exploded diagram of the fault-sided buffer regions.

Once a watertight framework is established, a set of fault-sided buffer regions may be established. For each given side of a fault, a region is defined. Various definition techniques may be employed, such as, e.g., including all mapping grid cells having a face on the fault, or including all simulation grid cells within a predetermined distance of the fault. Significantly, each region includes only grid cells on the given side of the fault, and excludes any grid cells from the other side of the fault. FIG. 3D shows a cross-hatched region for each side of each fault. Where the regions intersect, their intersection is treated as a separate region. For clarity, FIG. 3E shows an exploded view of the fault-sided buffer regions, with labels. In FIG. 3E, each region is labeled with a vector having three elements corresponding to the three faults. Each element has either a positive value ("+") (to indicate a first side of the corresponding fault), a negative value ("−") (to indicate the other side of the corresponding fault), or a zero value to indicate no proximity to the corresponding fault. Thus, for example, the regions labeled with (+,0,0) indicate grid cells on a first side of the first fault but not close to the second or third faults. Those cells not proximate to any fault may be considered to be in the (0,0,0) background region (not specifically labeled in the figures).

At some point during or after the gridding and partitioning process that leads to the situation depicted in FIG. 2D, petrophysical parameter values are assigned to each mesh cell and/or cell surface. Illustrative parameter values include transmissibility or flow rates between cells, rock type, porosity, permeability, oil saturation, groundwater saturation, gas saturation, clay content, and cementation. The assignment process is expected to be based on the geobody properties determined by scientists and engineers through their analysis of horizons, small scale features, and other geologic structures, but may also employ spatially correlated reservoir properties and/or fluid properties as derived from wellbore measurements, rock type probability maps, and geostatistical distributions. Geostatistics may be used in subsurface models to interpolate observed data and to superimpose an expected degree of variability. Kriging is a suitable geostatistic technique, which uses the spatial correlation among data to construct the interpolation via semi-variograms. Repeated interpolations with different variograms, different seeds, different training images, etc., may be performed to assess spatial uncertainties and determine a degree of confidence in the proposed interpretations.

Figure 2E:
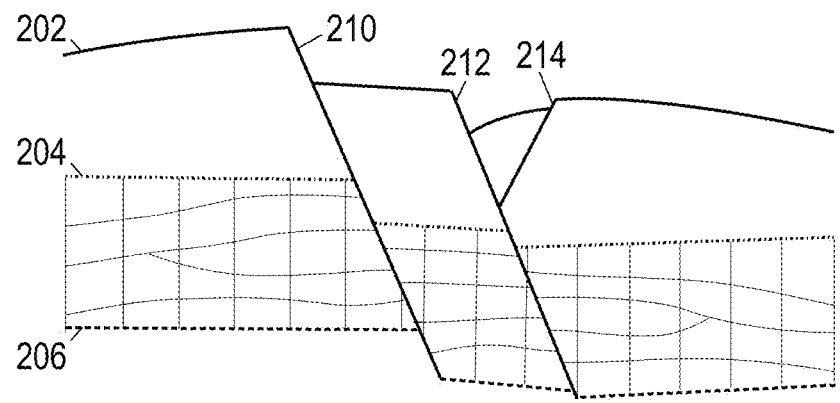
FIG. 2E is a cross-section of an illustrative physical-space model with a simulation mesh in a first zone.
Figure 2F:
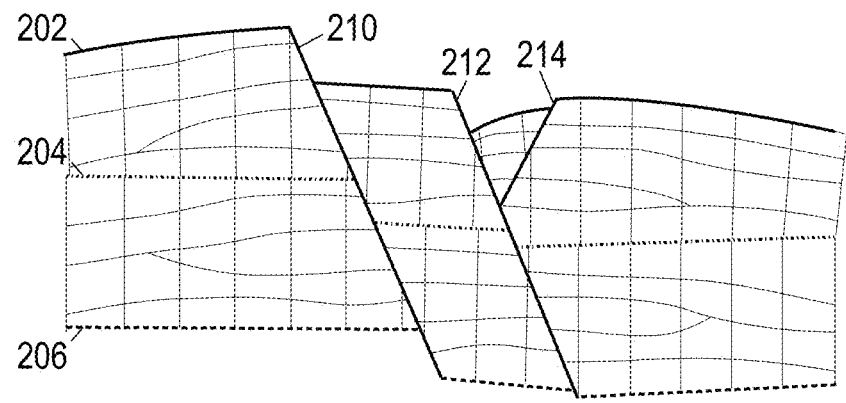
FIG. 2F is a cross-section of an illustrative physical-space model having a simulation mesh with misalignments at zone transitions.

From the multi-zone design space model represented by FIG. 2D, the derived mapping is applied in reverse ("reverse-mapping") to translate the design-space mesh into a real-space simulation mesh. As shown in FIGS. 2E and 2F, the reverse mapping process may be performed zone by zone in a directional fashion, e.g., bottom-up or top-down. It is the bottom-up process that is shown here, but the principles are equally applicable to a top-down process (or even to a center-outwards process).

The gridding and meshing of the design space are done using nodes to define grid and mesh cells, and when cells are partitioned into subcells by faults, additional nodes are created to define the subcells. These additional nodes lie on the fault surface and hence are at a potential discontinuity in the mapping function. The process for mapping a point from design-space to physical-space first determines which cell contains the point and then applies the reverse mapping function for that cell. Nodes at or near a mapping function discontinuity are vulnerable to numerical errors that may cause the node to be contained by a cell on the wrong side of a fault and thereby be subjected to an improper reverse mapping function causing significant distortions in the simulation mesh.

Each fault may be given a unique identification number or name, and the sides of each fault are assigned different identifiers (e.g., "+" and "−"). When the subcells are created, the additional nodes are positioned on a known side of the given fault. Thus, it is possible to restrict the search scope when searching for the appropriate grid cell to determine the proper reverse mapping function. In at least some embodiments, the scope is limited by excluding from the search any cells in the fault-sided buffer regions for the wrong side of the fault. Thus, with reference to FIGS. 3D-3E, a mapping function search for a node on the positive side of fault 302 would exclude the (−,x,x) buffer regions (where x is a wildcard that matches "−","+", and "0").

Returning to FIGS. 2E and 2F, the mapping between the design and real space is preferably done zone by zone for speediness of map generation and the convenience of property assignment in the design space. However, this practice may lead to discontinuous meshing across interfaces between zones. FIG. 2F shows the simulation grid that may result from applying independent zone mapping from FIG. 2D to the physical space. (The mesh discontinuities across horizon 204 are most evident in the center region of FIG. 2F.) The grid discontinuity may decrease flow simulation accuracy.

Figure 2G:
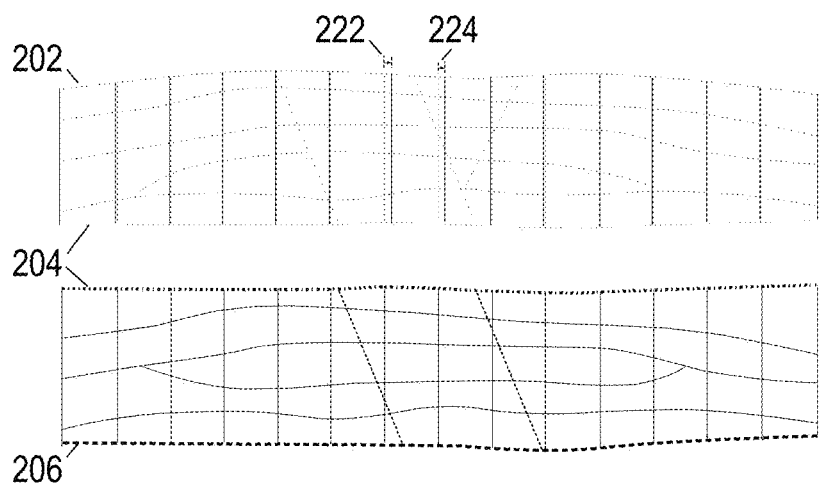
FIG. 2G is a cross-section of an illustrative multi-zone design space model with grid re-alignment.
Figure 2H:
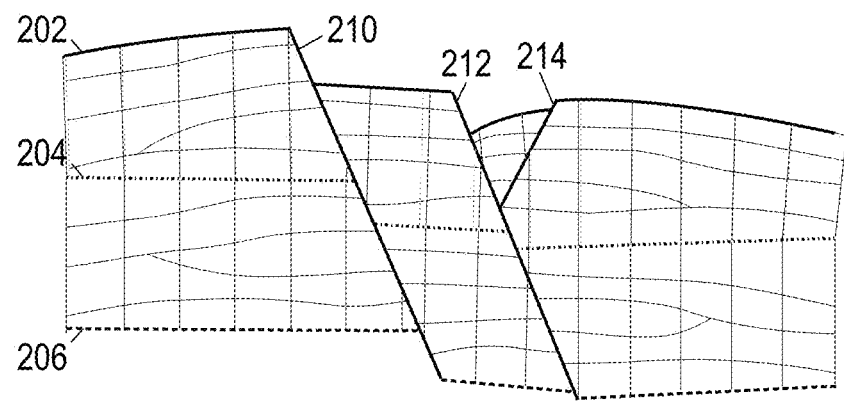
FIG. 2H is a cross-section of an illustrative physical-space model having an aligned simulation mesh.

To establish a continuous grid across zone interfaces, the physical space grid node locations on the top surface of the preceding zone are mapped to the bottom surface of the current zone in design space to serve as the initial node locations for defining the design space grid for the current zone. Accordingly, as shown in FIG. 2G (where the initial node locations are vertically extruded from the bottom horizon of each zone to find intersections with the surfaces representing the geobody boundaries), the initial node locations are shifted relative to the "naïve" gridding approach used in FIG. 2C. The shifts 222 and 224 in the center region are the most visible in FIG. 2G. When the shifted grid in this second design space zone is mapped to the second physical space zone as shown in FIG. 2H, the grids become aligned across the horizon 204. This process may be repeated for each subsequent zone, such that the initial node locations for the ith zone in design space are based on the top surface node locations of the (i−1)th zone ("connected zone") in physical space, if any such zone is present.

Figure 4:
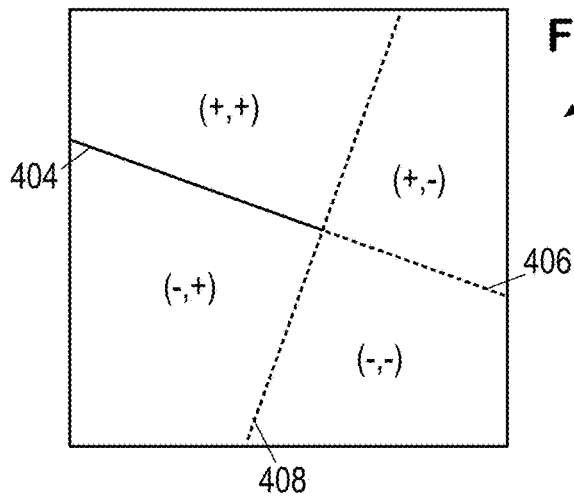
FIG. 4 is a plan view of a partially faulted horizon.

For grid cells that are adjacent to zone interfaces and cut by faults, we pair them by matching their bounding fault IDs and sideness. FIG. 4 shows a plan view of a grid cell face 402 on an interface surface between zones. A fault 404 is shown partially cutting across the cell face, with a pseudo-extension surface 406 that extends the fault to complete the division of the cell and a trim surface 408 intersecting the fault termination at an angle substantially perpendicular to the fault 404. The resulting subcells are labeled based on which side of the fault 404/extension 406 and which side of the trim surface 408 they are on. The (+,+) region indicates the positive side of the fault and the trim surface, the (+,−) region indicates the positive side of the fault and negative side of the trim surface, etc. When establishing connectivity across the zone interface in physical space, the (+,+) subcell face on the top surface of the preceding zone is matched to the corresponding subcell face on the bottom surface of the current zone, and so on.

Figure 2I:
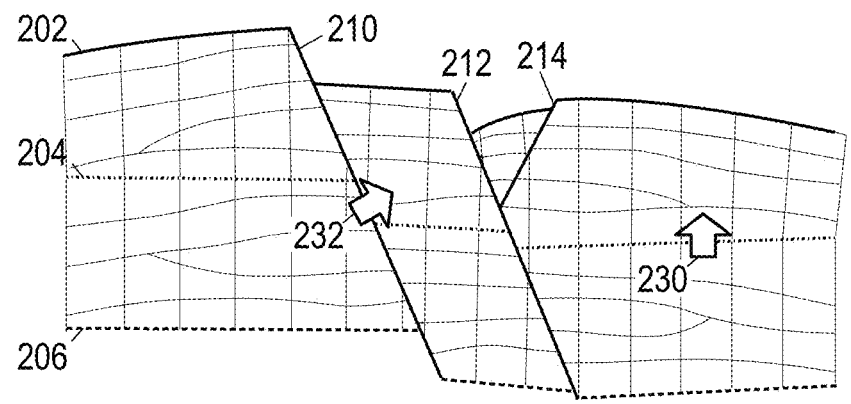
FIG. 2I is a cross-section of an illustrative physical-space model with cross-fault and cross-horizon connections between zones.

Once each of the zones in physical space have been gridded, the reservoir connectivity needs to be constructed in and between the zones. Connections between the cells that share the same faces can be automatically identified and the transmissibility of fluid across the shared face can be automatically computed. The use of a continuous grid and the fault-subcell face-matching technique described herein facilitates this process as applied across zone interfaces. This connection determination process is represented in FIG. 2I by arrow 230. For cells not cut by faults, the face matching is provided automatically by the continuity of the grid across the interface. For cells on the zone interface cut by faults, the subcells sharing the same fault and trim surface sides are matched and the appropriate connection transmissibility calculated.

Figure 5:
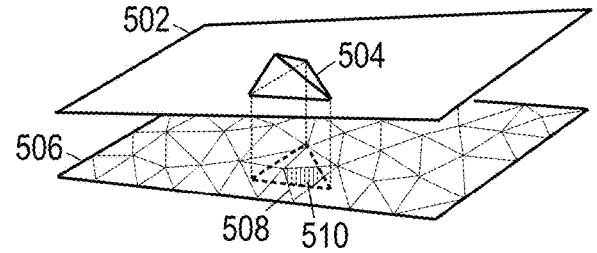
FIG. 5 is a perspective view of a cell face projected across a fault.

Thereafter, fault-crossing connections between zones (as indicated by arrow 232) may be determined. It is expected that the faces on opposite sides of the fault will not match due to displacement in the physical space. Accordingly, an overlap calculation may be performed between each pair of cell faces having opposite sideness. FIG. 5 shows a first fault surface 502 partially defined by one face 504 of a tetrahedral mesh cell. A second fault surface 506 is shown with an exaggerated separation from the first fault surface 502 for illustrative purposes. Fault surfaces 502 and 506 represent the positive and negative sides of a fault.

Fault surface 506 is shown as being tiled by cell faces including cell face 508, each of which has an opposite sideness from the cell face 504. Each positive side face (e.g., 504) is projected onto each negative side face (e.g., 508), and a polygon intersection calculation performed to determine the overlapping area 510 after the fault displacement. Overlapping area 510 is used as the flow area in the connection factor calculation for determining transmissibility between the corresponding cells. Each cell may have fluid flow connectivity with multiple cells on the opposite side of the fault. This determination overlapping areas between cell faces on opposite sides of a fault in real space is referred to herein as "face splitting".

We pause here to note the face-projection approach can also be applied across zone interfaces if it is deemed unnecessary to employ the grid-alignment process described previously. As with the cross-fault transmissivities, the cross-horizon transmissivities can be set in proportion to the overlapping areas.

Figure 6:
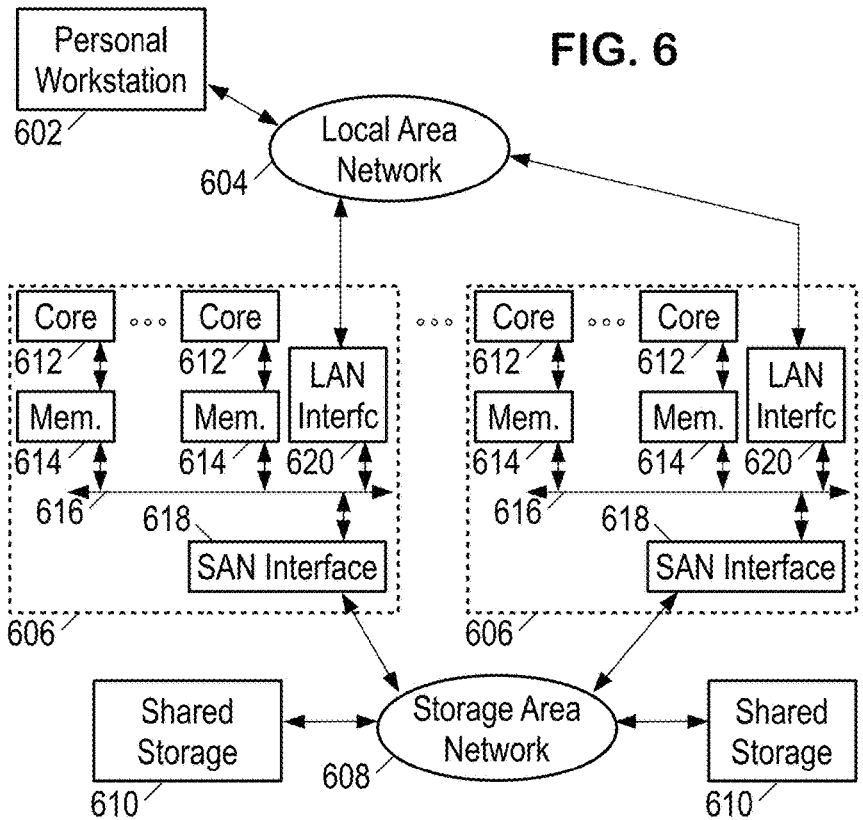
FIG. 6 is a block diagram of an illustrative subsurface modeling system.

FIG. 6 is a block diagram of an illustrative subsurface modeling system. The illustrative subsurface modeling system includes a personal workstation 602 coupled via a local area network (LAN) 604 to one or more multi-processor computers 606, which are in turn coupled via a storage area network (SAN) 608 to one or more shared storage units 610. Personal workstation 602 serves as a user interface to the subsurface modeling system, enabling a user to load data into the system, to configure and monitor the operation of the system, and to retrieve the results (often in the form of image data) from the system. Personal workstation 602 may take the form of a desktop computer with a display that graphically shows representations of the input and result data, and with a keyboard that enables the user to move files and execute processing software. LAN 604 provides high-speed communication between multi-processor computers 606 and with personal workstation 602. The LAN 604 may take the form of an Ethernet network.

Multi-processor computer(s) 606 provide parallel processing capability to enable suitably prompt processing of the input data to derive the results data. Each computer 606 includes multiple processors 612, distributed memory 614, an internal bus 616, a SAN interface 618, and a LAN interface 620. Each processor 612 operates on allocated tasks to solve a portion of the overall problem and contribute to at least a portion of the overall results. Associated with each processor 612 is a distributed memory module 614 that stores application software and a working data set for the processors' use. Internal bus 616 provides inter-processor communication and communication to the SAN or LAN networks via the corresponding interfaces 618, 620. Communication between processors in different computers 606 can be provided by LAN 604.

SAN 608 provides high-speed access to shared storage devices 610. The SAN 608 may take the form of, e.g., a Fibrechannel or Infiniband network. Shared storage units 610 may be large, stand-alone information storage units that employ magnetic disk media for nonvolatile data storage. To improve data access speed and reliability, the shared storage units 610 may be configured as a redundant disk array ("RAID").

The processors 612 cooperatively execute subsurface modeling software stored in the distributed memory and/or on the shared storage units, which configures to processors to retrieve measurement data and stored model information from the shared storage units 610, operate on the retrieved data and information to implement the modeling methods and improvements disclosed herein, and to store the resulting subsurface models on the shared storage units 610 for future use. Such future use includes visualization methods to convey model information to users, simulation of reservoir fluid movements, and evaluation of well placement and production strategies, enabling users to select sites for drillers to direct boreholes, complete wells, and produce reservoir fluids in an efficient manner.

Figure 7:
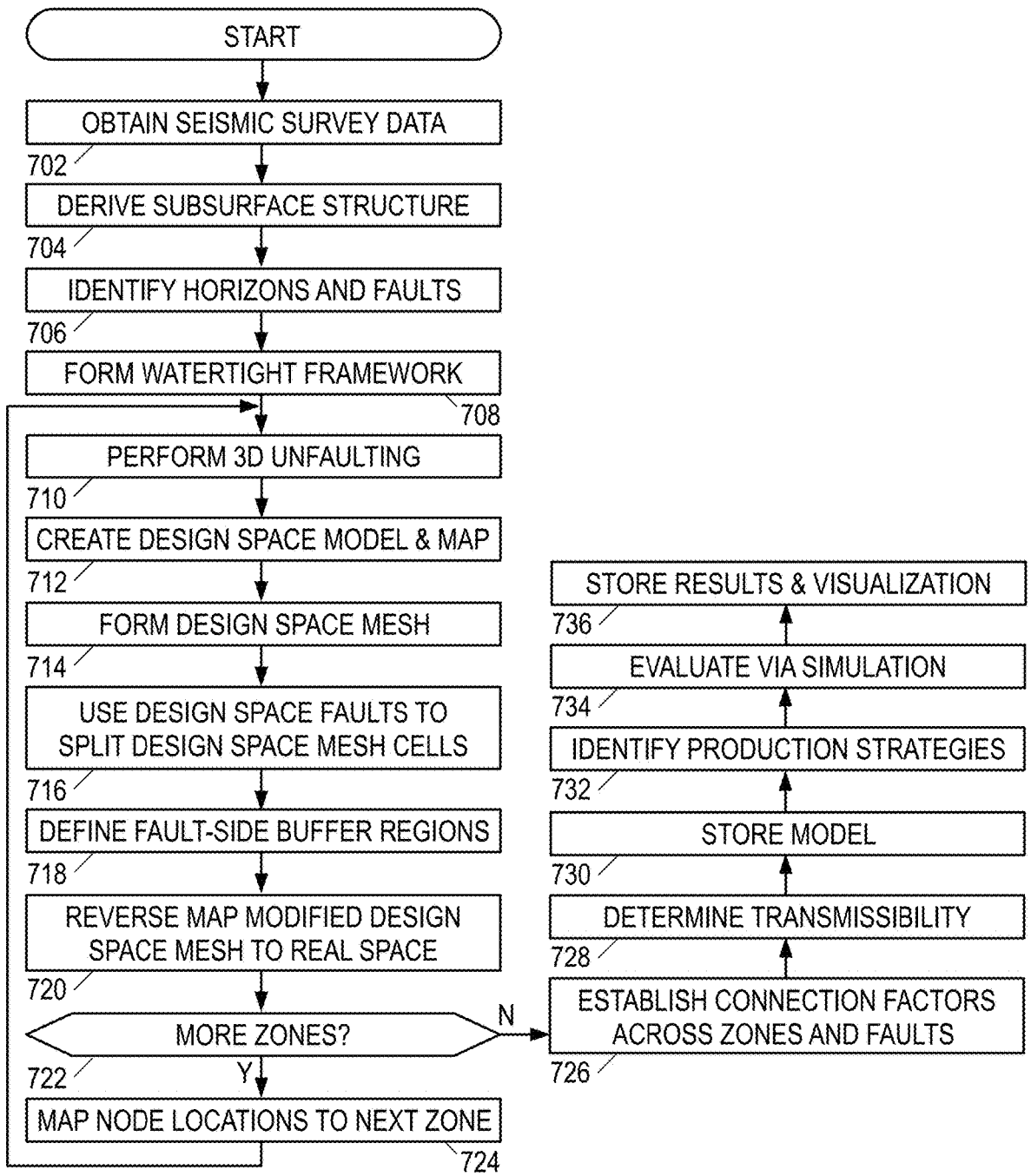
FIG. 7 is a flow diagram of an illustrative subsurface modeling method.

FIG. 7 is a flow diagram of an illustrative subsurface modeling method. It begins in block 702 with the system obtaining seismic survey trace signal data pertaining to a region of interest. In block 704, the system migrates and/or inverts the seismic survey traces to derive at least a high-level picture of the subsurface structure, usually embodied as a volumetric property distribution model in the physical space. In block 706, the physical space model is examined to "interpret" the data, i.e., to identify horizons representing formation boundaries, faults, and any other discernable structures. While this interpretation can be automated to at least some degree, the industry typically employs a geologist or other professional to supervise the interpretation process and/or to perform the interpretation manually. In block 708, the system derives continuous-function based representations of the fault and horizon surfaces, extrapolating and truncating as needed to provide a watertight subsurface model.

Blocks 710-724 are shown as a loop to represent zone-by-zone processing. Beginning with a first zone (e.g., the topmost or bottom-most zone) in block 710, the system analyzes the faulted formations and derives a real-to-design space mapping that heals the faults in that zone. In block 712, the mapping is applied to the real space model to obtain unfaulted horizons and geobodies in design space. The system may perform further guided or unguided analysis of the design space model to identify additional geobodies or horizons that were not evident in the real-space model, and to assign material properties to each geobody in the current zone. In block 714, the system applies a gridding method to the design space model to derive in the current zone a design space mesh having cells with homogeneous (or otherwise well-defined) material properties.

In block 716, the system applies the real-to-design space mapping to the faults, determining the design-space location of these faults. The design space mesh cells intersected by the faults are partitioned or otherwise modified to align mesh cell boundaries with the fault surface. The system then applies the real-to-design space mapping in reverse to map this zone's modified mesh to obtain a simulation mesh for the corresponding zone of the real-space model in block 720. In block 722, the system determines whether all zones have been completed. If not, then in block 724 the system maps the node locations established for the fault interface of the current zone in real space to the corresponding interface of the next zone in design space. (The mapped node locations will be the initial nodes for the gridding process in block 714.) Control then returns to block 710.

One the simulation grid has been established for all zones in real space, the system in block 726 determines the connection factors between cells within each zone, between cells across from each other on the zone interfaces, and between cells on opposite sides of each fault. In block 728, the system uses the connection factors to determine fluid transmissibilities between cells.

In block 730, the system stores the model and simulation mesh to disk or some other form of nontransient information storage medium. The system may also display or output the model and, optionally, provide an interactive visualization of the model to a user.

In block 732, the system configures the subsurface model in accordance with an identified reservoir development strategy, e.g., by specifying well locations, completion zones, and production rates. In block 734 the system simulates production from the reservoir to evaluate the identified strategy. Blocks 732 and 734 may be repeated as needed to evaluate different strategies and refinements thereof in an organized fashion designed to identify preferred strategies. In block 736 the system stores at least the results of each simulation, optionally displaying the results and offering an interactive visualization of the simulation and model to a user.

The above described approach to deriving a simulation mesh is expected to yield higher-quality results (in terms of k-orthogonality and cell alignments) with lower computational demands than current methods.

Though the operations shown and described in the flow diagram are treated as being sequential for explanatory purposes, in practice the method may be carried out by multiple processors operating concurrently and perhaps even speculatively to enable out-of-order operations. The ordering and sequential treatment is not meant to be limiting. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

Embodiments of the present techniques also relate to an apparatus for performing the operations herein. This apparatus may be specially constructed (in a physical or virtual environment) for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.).

Furthermore, as will be apparent to one of ordinary skill in the relevant art, the modules, features, attributes, methodologies, and other aspects of the present disclosure can be implemented as software, hardware, firmware or any combination of the three. Of course, wherever a component of the present disclosure is implemented as software, the component can be implemented as a standalone program, as part of a larger program, as a plurality of separate programs, as a statically or dynamically linked library, as a kernel loadable module, as a device driver, and/or in any other way known to those of skill in the art of computer programming. The software, hardware, or firmware embodying the disclosed methods may implement machine-readable logic, such that a set of instructions or code residing in memory, when executed, causes one or more processors to employ the other components of a computer system as needed to perform the disclosed methods.

The following example embodiments of the invention are also described.

Embodiment 1. A geologic modeling method that comprises obtaining a geologic model representing a subsurface region in physical space, the subsurface region being divided into multiple zones; sequentially generating a physical space simulation mesh for each of said multiple zones by: mapping a current zone of the physical space geologic model to a current zone of a design space model representing a current zone of an unfaulted subsurface region; gridding the design space model to obtain a design space mesh that honors stratigraphic surfaces, said gridding beginning with an initial set of nodes on a first horizon of the current zone of the design space model, said initial set of nodes being determined by mapping nodes from a corresponding horizon of a physical space simulation mesh of a previously-gridded zone, if any; partitioning cells in the current zone of the design space mesh with faults mapped from the current zone of the physical space geologic model, thereby obtaining a partitioned design space mesh for the current zone; and reverse mapping the partitioned design space mesh for the current zone to the physical space for the current zone, by applying a map function to each node of the partitioned design space mesh to determine the corresponding location in the physical space geologic model; and outputting the physical space simulation mesh.

Embodiment 2. The method of Embodiment 1, wherein said outputting includes storing the physical space simulation mesh on a non-transitory information storage device; and displaying a visual representation of the geologic model with the physical space simulation mesh.

Embodiment 3. The method of Embodiment 1 or 2, further comprising employing the physical space simulation mesh to evaluate a well placement strategy or to evaluate a hydrocarbon volume.

Embodiment 4. The method of any one of Embodiments 1-3, wherein said sequentially generating proceeds in a directional fashion from a bottom-most zone to a top-most zone.

Embodiment 5. The method of any one of Embodiments 1-4, wherein said applying a map function includes identifying, for each design space mesh node in design space, a mapping cell containing that node, the map function being different for each mapping cell.

Embodiment 6. The method of Embodiment 5, wherein said identifying includes searching a set of mapping cells, and wherein if the node is associated with a given side of a fault, the set excludes any buffer regions associated with an opposite side of the fault.

Embodiment 7. The method of any one of Embodiments 1-6, further comprising determining cross-horizon transmissibilities between physical space geologic model mesh cells adjacent to each other across a zone interface.

Embodiment 8. The method of Embodiment 7, wherein said adjacent physical space geologic model mesh cells are at least partially partitioned by a fault having an approximately perpendicular trim surface at its terminus, the fault at least partly defining multiple subcells, and wherein said cross-horizon transmissibilities are determined between subcells on a same side of the fault and on a same side of the trim surface, but are zero or not determined between subcells with different sideness.

Embodiment 9. The method of Embodiment 7, further comprising determining cross-fault transmissibilities between physical space geologic model mesh cells adjacent to each other across a fault by: projecting a mesh cell face onto a face of a mesh cell on an opposite side of the fault; and determining an overlapping area.

Embodiment 10. The method of any one of Embodiments 1-9, wherein said gridding includes using the initial set of nodes to specify an areal grid spanning the design space model in a horizontal direction; identifying, as additional nodes, intersections of vertical extrusions of the vertices of the areal grid with the geobody surfaces in the design space model; adding additional nodes between the intersections to increase vertical resolution; and connecting said nodes to form the design space mesh.

Embodiment 11. A geologic modeling method that comprises obtaining a geologic model representing a subsurface region in physical space, the subsurface region having faults organized in an order; mapping the physical space geologic model to a design space model representing an unfaulted subsurface region; gridding the design space model to obtain a design space mesh; applying the faults in said order to partition cells in the design space mesh, thereby obtaining a partitioned design space mesh; reverse mapping the partitioned design space mesh to the physical space to obtain a physical space simulation mesh by applying a map function to each node of the partitioned design space mesh to determine the corresponding location in the physical space geologic model; and outputting the physical space simulation mesh.

Embodiment 12. The method of Embodiment 11, wherein said outputting includes storing the physical space simulation mesh on a non-transitory information storage device; and displaying a visual representation of the geologic model with the physical space simulation mesh.

Embodiment 13. The method of Embodiment 11 or 12, further comprising employing the physical space simulation mesh to evaluate a well placement strategy or to evaluate a hydrocarbon volume.

Embodiment 14. The method of any one of Embodiments 11-13, wherein said applying includes extending and truncating faults as needed to form a watertight model in design space, the faults higher in said order truncating faults lower in said order at intersections of said faults, such that faults lower in the order only partition subcells on one side of the higher order faults.

Embodiment 15. The method of Embodiment 14, wherein said reverse mapping includes identifying, for each node in design space, a cell containing that node; and applying a map function associated with the identified cell to determine a corresponding location in the physical space geologic model.

Embodiment 16. The method of Embodiment 15, wherein said identifying includes searching a set of cells, and wherein if the node is associated with a given side of a fault, the set excludes any buffer regions associated with an opposite side of the fault.

Embodiment 17. The method of any one of Embodiments 11-16, further comprising determining cross-fault transmissibilities between physical space geologic model mesh cells adjacent to each other across a fault by: projecting a mesh cell face onto a face of a mesh cell on an opposite side of the fault; and determining an overlapping area.

Embodiment 18. A geologic modeling system that comprises a memory having geologic modeling software; and one or more processors coupled to the memory to execute the geologic modeling software, the software causing the one or more processors to perform operations including: obtaining a geologic model representing a subsurface region in physical space, the subsurface region being divided into multiple zones; sequentially generating a physical space simulation mesh for each of said multiple zones by: mapping a current zone of the physical space geologic model to a current zone of a design space model representing a current zone of an unfaulted subsurface region; gridding the design space model to obtain a design space mesh, said gridding beginning with an initial set of nodes on a first horizon of the current zone of the design space model, said initial set of nodes being determined by mapping nodes from a last horizon of a physical space simulation mesh for a preceding zone, if any; partitioning cells in the current zone of the design space mesh with faults mapped from the current zone of the physical space geologic model, thereby obtaining a partitioned design space mesh for the current zone; and reverse mapping the partitioned design space mesh for the current zone to the physical space for the current zone; and outputting the physical space simulation mesh.

Embodiment 19. The system of Embodiment 18, wherein said outputting includes storing the physical space simulation mesh on a non-transitory information storage device; and displaying a visual representation of the geologic model with the physical space simulation mesh.

Embodiment 20. The system of Embodiment 18 or 19, wherein the operations further include employing the physical space simulation mesh to evaluate a well placement strategy.

Embodiment 21. The system of any one of Embodiments 18-20, wherein said reverse mapping includes identifying, for each node in design space, a cell containing that node, said identifying including searching a set of cells, the set excluding any buffer regions associated with an opposite side of any fault associated with the node; and applying a map function associated with the identified cell to determine a corresponding location in the physical space geologic model.

Embodiment 22. The system of any one of Embodiments 18-21, wherein the operations further include determining cross-horizon transmissibilities between physical space geologic model mesh cells adjacent to each other across a zone interface.

Embodiment 23. The system of any one of Embodiments 18-22, wherein said adjacent physical space geologic model mesh cells are at least partially partitioned by a fault having a perpendicular trim surface at its terminus, the fault at least partly defining multiple subcells, and wherein said cross-horizon transmissibilities are determined between subcells on a same side of the fault and on a same side of the trim surface, but are zero or not determined between subcells with different sideness.

Embodiment 24. The system of any one of Embodiments 18-23, wherein the operations further include determining cross-fault transmissibilities between physical space geologic model mesh cells adjacent to each other across a fault by: projecting a mesh cell face onto a face of a mesh cell on an opposite side of the fault; and determining an overlapping area.

Embodiment 25. The system of any one of Embodiments 18-24, wherein said gridding includes: using the initial set of nodes to specify an areal grid spanning the design space model in a horizontal direction; identifying, as additional nodes, intersections of vertical extrusions of the vertices of the areal grid with the geobody surfaces in the design space model; adding additional nodes between the intersections to increase vertical resolution; and connecting said nodes to form the design space mesh.

Embodiment 26. A geologic modeling system that comprises: a memory having geologic modeling software; and one or more processors coupled to the memory to execute the geologic modeling software, the software causing the one or more processors to perform operations including: obtaining a geologic model representing a subsurface region in physical space, the subsurface region having faults organized in a hierarchy; mapping the physical space geologic model to a design space model representing an unfaulted subsurface region; gridding the design space model to obtain a design space mesh; applying the faults in hierarchical order to partition cells in the design space mesh, thereby obtaining a partitioned design space mesh; reverse mapping the partitioned design space mesh to the physical space to obtain a physical space simulation mesh; and outputting the physical space simulation mesh.

Embodiment 27. The system of Embodiment 26, wherein said outputting includes: storing the physical space simulation mesh on a non-transitory information storage device; and displaying a visual representation of the geologic model with the physical space simulation mesh.

Embodiment 28. The system of Embodiment 26 or 27, wherein the operations further include employing the physical space simulation mesh to evaluate a well placement strategy.

Embodiment 29. The system of any one of Embodiments 26-28, wherein said applying includes extending and truncating faults as needed to form a watertight model in design space, the faults higher in said hierarchy truncating faults lower in said hierarchy at intersections of said faults, such that faults lower in the hierarchy only partition subcells on one side of the higher hierarchy faults.

Embodiment 30. The system of Embodiment 29, wherein said reverse mapping includes: identifying, for each node in design space, a cell containing that node, said identifying including searching a set of cells, the set excluding any buffer regions associated with an opposite side of any fault associated with the node; and applying a map function associated with the identified cell to determine a corresponding location in the physical space geologic model.

Embodiment 31. The system of any one of Embodiments 26-30, wherein the operations further include determining cross-fault transmissibilities between physical space geologic model mesh cells adjacent to each other across a fault by: projecting a mesh cell face onto a face of a mesh cell on an opposite side of the fault; and determining an overlapping area.

Embodiment 32. A non-transitory information storage product having computer readable program code embodied therein, which when executed configures a computer to implement a geologic modeling method that comprises: obtaining a geologic model representing a subsurface region in physical space, the subsurface region being divided into multiple zones; sequentially generating a physical space simulation mesh for each of said multiple zones by: mapping a current zone of the physical space geologic model to a current zone of a design space model representing a current zone of an unfaulted subsurface region; gridding the design space model to obtain a design space mesh, said gridding beginning with an initial set of nodes on a first horizon of the current zone of the design space model, said initial set of nodes being determined by mapping nodes from a last horizon of a physical space simulation mesh for a preceding zone, if any; partitioning cells in the current zone of the design space mesh with faults mapped from the current zone of the physical space geologic model, thereby obtaining a partitioned design space mesh for the current zone; and reverse mapping the partitioned design space mesh for the current zone to the physical space for the current zone; and outputting the physical space simulation mesh.

Embodiment 33. The non-transitory information storage product of Embodiment 32, wherein said outputting includes: storing the physical space simulation mesh on a non-transitory information storage device; and displaying a visual representation of the geologic model with the physical space simulation mesh.

Embodiment 34. The non-transitory information storage product of Embodiment 32 or 33, wherein the method further comprises: employing the physical space simulation mesh to evaluate a well placement strategy.

Embodiment 35. A non-transitory information storage product having computer readable program code embodied therein, which when executed configures a computer to implement a geologic modeling method that comprises: obtaining a geologic model representing a subsurface region in physical space, the subsurface region having faults organized in a hierarchy; mapping the physical space geologic model to a design space model representing an unfaulted subsurface region; gridding the design space model to obtain a design space mesh; applying the faults in hierarchical order to partition cells in the design space mesh, thereby obtaining a partitioned design space mesh; reverse mapping the partitioned design space mesh to the physical space to obtain a physical space simulation mesh; and outputting the physical space simulation mesh.

Embodiment 36. The non-transitory information storage product of Embodiment 35, wherein said outputting includes: storing the physical space simulation mesh on a non-transitory information storage device; and displaying a visual representation of the geologic model with the physical space simulation mesh.

Embodiment 37. The non-transitory information storage product of Embodiment 35, wherein the method further comprises: employing the physical space simulation mesh to evaluate a well placement strategy.

Embodiment 38. A geologic modeling method that comprises: obtaining a geologic model representing a subsurface region in physical space, the subsurface region being divided into multiple zones; sequentially generating a physical space simulation mesh for each of said multiple zones by: mapping a current zone of the physical space geologic model to a current zone of a design space model representing a current zone of an unfaulted subsurface region; gridding the design space model to obtain a design space mesh that honors stratigraphic surfaces; partitioning cells in the current zone of the design space mesh with faults mapped from the current zone of the physical space geologic model, thereby obtaining a partitioned design space mesh for the current zone; and reverse mapping the partitioned design space mesh for the current zone to the physical space for the current zone, by applying a map function to each node of the partitioned design space mesh to determine the corresponding location in the physical space geologic model; determining cross-horizon transmissibilities between physical space geologic model mesh cells adjacent to each other across a zone interface by: projecting a mesh cell face onto a face of a mesh cell on an opposite side of the fault; and determining an overlapping area; and outputting the physical space simulation mesh.

Embodiment 39. The method of Embodiment 38, wherein said outputting includes: storing the physical space simulation mesh on a non-transitory information storage device; and displaying a visual representation of the geologic model with the physical space simulation mesh.

Embodiment 40. The method of Embodiment 38 or 39, further comprising employing the physical space simulation mesh to evaluate a well placement strategy or to evaluate a hydrocarbon volume.

What is claimed is:

1. A geologic modeling method that comprises:
    obtaining a geologic model representing a subsurface region in physical space, the subsurface region being divided into multiple zones;
    sequentially generating a physical space simulation mesh for each of said multiple zones by: mapping a current zone of the physical space geologic model to a current zone of a design space model representing a current zone of an unfaulted subsurface region;
    gridding the design space model to obtain a design space mesh that honors stratigraphic surfaces, said gridding beginning with an initial set of nodes on a first horizon of the current zone of the design space model, said initial set of nodes being determined by mapping nodes from a corresponding horizon of a physical space simulation mesh of a previously-gridded zone, if any;
    partitioning cells in the current zone of the design space mesh with faults mapped from the current zone of the physical space geologic model, thereby obtaining a partitioned design space mesh for the current zone; and
    reverse mapping the partitioned design space mesh for the current zone to the physical space for the current zone, by applying a map function to each node of the partitioned design space mesh to determine the corresponding location in the physical space geologic model;
    determining cross-horizon transmissibilities between physical space geologic model mesh cells adjacent to each other across a zone interface by: projecting a mesh cell face onto a face of a mesh cell on an opposite side of the fault; and determining an overlapping area, wherein said adjacent physical space geologic model mesh cells are at least partially partitioned by a fault having an approximately perpendicular trim surface at its terminus, the fault at least partly defining multiple subcells, and wherein said cross-horizon transmissibilities are determined between subcells on a same side of the fault and on a same side of the trim surface, but are zero or not determined between subcells with different sideness; and outputting the physical space simulation mesh.

2. The method of claim 1, wherein said outputting includes:
storing the physical space simulation mesh on a non-transitory information storage device; and
displaying a visual representation of the geologic model with the physical space simulation mesh.

3. The method of claim 1, further comprising employing the physical space simulation mesh to evaluate a well placement strategy or to evaluate a hydrocarbon volume.

4. The method of claim 1, wherein said sequentially generating proceeds in a directional fashion from a bottom-most zone to a top-most zone.

5. The method of claim 1, wherein said applying a map function includes:
identifying, for each design space mesh node in design space, a mapping cell containing that node, the map function being different for each mapping cell.

6. The method of claim 5, wherein said identifying includes searching a set of mapping cells, and wherein if the node is associated with a given side of a fault, the set excludes any buffer regions associated with an opposite side of the fault.

7. The method of claim 1, wherein said gridding includes:
using the initial set of nodes to specify an areal grid spanning the design space model in a horizontal direction;
identifying, as additional nodes, intersections of vertical extrusions of the vertices of the areal grid with the geobody surfaces in the design space model;
adding additional nodes between the intersections to increase vertical resolution; and
connecting said nodes to form the design space mesh.

8. A geologic modeling system that comprises:
a memory having geologic modeling software; and
one or more processors coupled to the memory to execute the geologic modeling software, the software causing the one or more processors to perform operations comprising the method of claim 1.

9. A non-transitory information storage product having computer readable program code embodied therein, which when executed configures a computer to implement the method of claim 1.

10. A geologic modeling method that comprises:
obtaining a geologic model representing a subsurface region in physical space, the subsurface region having faults organized in an order;
mapping the physical space geologic model to a design space model representing an unfaulted subsurface region;
gridding the design space model to obtain a design space mesh;
applying the faults in said order to partition cells in the design space mesh, thereby obtaining a partitioned design space mesh;
reverse mapping the partitioned design space mesh to the physical space to obtain a physical space simulation mesh by applying a map function to each node of the partitioned design space mesh to determine the corresponding location in the physical space geologic model;
determining cross-fault transmissibilities between physical space geologic model mesh cells adjacent to each other across a fault by: projecting a mesh cell face onto a face of a mesh cell on an opposite side of the fault; and determining an overlapping area, wherein said adjacent physical space geologic model mesh cells are at least partially partitioned by a fault having an approximately perpendicular trim surface at its terminus, the fault at least partly defining multiple subcells, and wherein said cross-horizon transmissibilities are determined between subcells on a same side of the fault and on a same side of the trim surface, but are zero or not determined between subcells with different sideness; and
outputting the physical space simulation mesh.

11. The method of claim 10, wherein said outputting includes:
storing the physical space simulation mesh on a non-transitory information storage device; and
displaying a visual representation of the geologic model with the physical space simulation mesh.

12. The method of claim 10, further comprising employing the physical space simulation mesh to evaluate a well placement strategy or to evaluate a hydrocarbon volume.

13. The method of claim 10, wherein said applying includes extending and truncating faults as needed to form a watertight model in design space, the faults higher in said order truncating faults lower in said order at intersections of said faults, such that faults lower in the order only partition subcells on one side of the higher order faults.

14. The method of claim 13, wherein said reverse mapping includes:
identifying, for each node in design space, a cell containing that node; and
applying a map function associated with the identified cell to determine a corresponding location in the physical space geologic model.

15. The method of claim 14, wherein said identifying includes searching a set of cells, and wherein if the node is associated with a given side of a fault, the set excludes any buffer regions associated with an opposite side of the fault.

16. A geologic modeling system that comprises:
a memory having geologic modeling software; and
one or more processors coupled to the memory to execute the geologic modeling software, the software causing the one or more processors to perform operations comprising the method of claim 10.

17. A non-transitory information storage product having computer readable program code embodied therein, which when executed configures a computer to implement the method of claim 10.

18. A geologic modeling method that comprises:
obtaining a geologic model representing a subsurface region in physical space, the subsurface region being divided into multiple zones;
sequentially generating a physical space simulation mesh for each of said multiple zones by:
mapping a current zone of the physical space geologic model to a current zone of a design space model representing a current zone of an unfaulted subsurface region;
gridding the design space model to obtain a design space mesh that honors stratigraphic surfaces;

partitioning cells in the current zone of the design space mesh with faults mapped from the current zone of the physical space geologic model, thereby obtaining a partitioned design space mesh for the current zone; and reverse mapping the partitioned design space mesh for the current zone to the physical space for the current zone, by applying a map function to each node of the partitioned design space mesh to determine the corresponding location in the physical space geologic model;

determining cross-horizon transmissibilities between physical space geologic model mesh cells adjacent to each other across a zone interface by: projecting a mesh cell face onto a face of a mesh cell on an opposite side of the fault; and determining an overlapping area, wherein said adjacent physical space geologic model mesh cells are at least partially partitioned by a fault having an approximately perpendicular trim surface at its terminus, the fault at least partly defining multiple subcells, and wherein said cross-horizon transmissibilities are determined between subcells on a same side of the fault and on a same side of the trim surface, but are zero or not determined between subcells with different sideness; and outputting the physical space simulation mesh.

19. The method of claim 18, wherein said outputting includes:

storing the physical space simulation mesh on a non-transitory information storage device; and displaying a visual representation of the geologic model with the physical space simulation mesh.

20. The method of claim 18, further comprising employing the physical space simulation mesh to evaluate a well placement strategy or to evaluate a hydrocarbon volume.

* * * * *